(12) United States Patent
Banna

(10) Patent No.: US 7,973,344 B2
(45) Date of Patent: Jul. 5, 2011

(54) DOUBLE GATE JFET WITH REDUCED AREA CONSUMPTION AND FABRICATION METHOD THEREFOR

(75) Inventor: Srinivasan R. Banna, San Jose, CA (US)

(73) Assignee: SuVolta, Inc., Los Gatos, CA (US)

( * ) Notice: Subject to any disclaimer, the term of this patent is extended or adjusted under 35 U.S.C. 154(b) by 430 days.

(21) Appl. No.: 12/113,118

(22) Filed: Apr. 30, 2008

(65) Prior Publication Data

US 2008/0272406 A1 Nov. 6, 2008

Related U.S. Application Data

(60) Provisional application No. 60/927,305, filed on May 1, 2007.

(51) Int. Cl.
*H01L 29/808* (2006.01)
*H01L 21/337* (2006.01)

(52) U.S. Cl. ........ 257/256; 257/270; 257/272; 257/274; 257/280; 257/281; 257/282; 257/283; 257/E29.312; 257/E29.317; 257/E29.319; 257/E27.08; 257/E27.081

(58) Field of Classification Search ................... 438/186, 438/188, 195–196; 257/504, 256, 270, 272, 257/274, 280–283, 134, 145, E29.31, E29.312, 257/E29.317, E29.319, E27.08, E27.081, 257/E27.069
See application file for complete search history.

(56) References Cited

U.S. PATENT DOCUMENTS

| 5,668,397 | A | 9/1997 | Davis et al. |
| 5,972,758 | A * | 10/1999 | Liang ............................ 438/294 |
| 6,277,697 | B1 * | 8/2001 | Lee ............................... 438/296 |
| 7,557,393 | B2 * | 7/2009 | Vora ............................. 257/261 |
| 2004/0058499 | A1 * | 3/2004 | Ishitsuka et al. ............. 438/296 |
| 2005/0173726 | A1 | 8/2005 | Potts |

OTHER PUBLICATIONS

Parke S., et al. "Flexfet: A Low-Cost, Rad-Hard, Independent-Double-Gate SOI CMOS Technology with Flexible, Dynamic Reconfigurability" Aerospace, 2005 IEEE Conference Big Sky, MT. USA May 12, 2005, Piscataway. NJ USA, IEEE. Pitcataway, NJ. USA, pp. 1-8.

* cited by examiner

*Primary Examiner* — A. Sefer
*Assistant Examiner* — Ermias Woldegeorgis
(74) *Attorney, Agent, or Firm* — Perkins Coie LLP

(57) ABSTRACT

Double gate JFET with reduced area consumption and fabrication method therefore. Double-gate semiconductor device including a substrate having a shallow trench isolator region comprising a first STI and a second STI, a channel region having a first and second channel edges, the channel region formed in the substrate and disposed between and in contact with the first STI and the second STI at the first and second channel edge. The first STI has a first cavity at the first channel edge, and the second STI has a second cavity at the second channel edge. The device further includes a gate electrode region comprising conductive material filling at least one of the first and second cavities. At least one of the first and second cavities is physically configured to provide electrical coupling of the gate electrode region to a back-gate P-N junction.

19 Claims, 10 Drawing Sheets

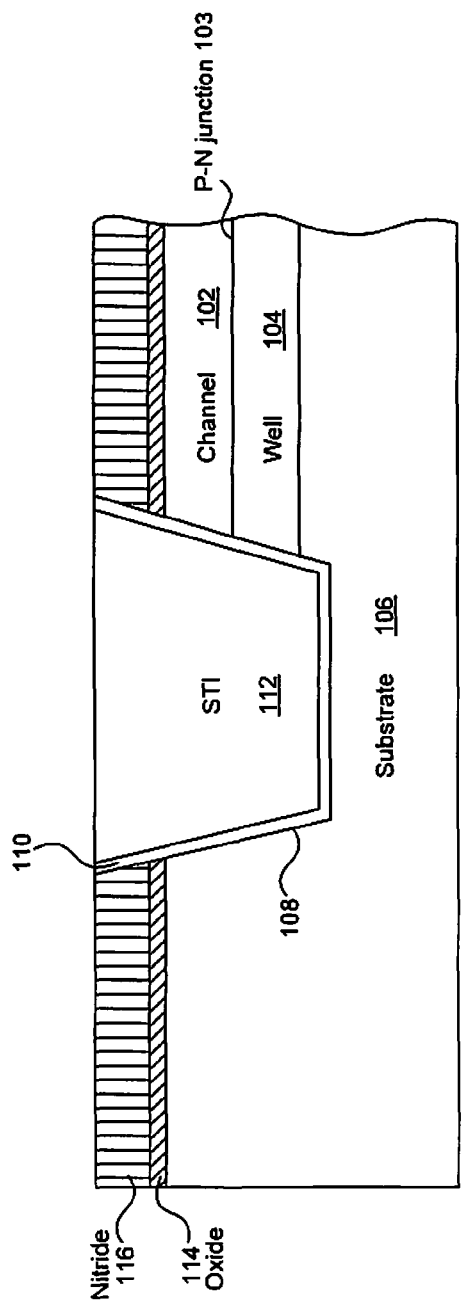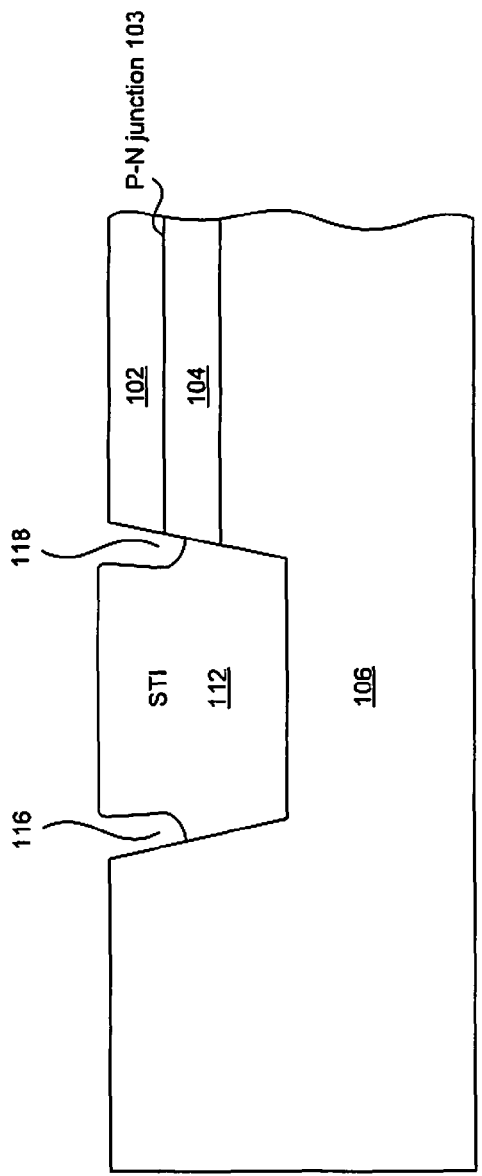

US 7,973,344 B2

DOUBLE GATE JFET WITH REDUCED AREA CONSUMPTION AND FABRICATION METHOD THEREFOR

CROSS-REFERENCE TO RELATED APPLICATIONS

This application claims the benefit of priority under one or more of 35 U.S.C. 119 and 35 U.S.C. 120 and is related to U.S. Provisional Patent Application No. 60/927,305 filed May 1, 2007 naming as inventor Srinivasa Banna and entitled DOUBLE GATE OPERATION IN ADVANCED JUNCTION FIELD EFFECT TRANSISTORS, which application is hereby incorporated by reference.

FIELD OF THE INVENTION

This invention relates generally to semiconductor devices, and, more particularly, to double gate field-effect transistors with reduced area.

BACKGROUND

It is desirable to make transistors as small as possible so that more can be put on a given size integrated circuit die. This allows ever more complex circuits to be made and more economically as line widths decrease.

CMOS transistors have encountered difficulties lately as line widths and design rules have shrunken to the sub-100 nanometer region, such as to 45-nanometer and smaller line widths and design rules. Some CMOS problems have to do with excessively high static power consumption when the CMOS pair is not switching and there should not be any power consumed. This problem arises at least in part from short channel effects which become more pronounced as line widths decrease.

One attempted solution to this problem has taken the form of Junction Field Effect Transistors (JFET) with doping profiles controlled so as to make the transistor operate in enhancement mode so that it has essentially zero drain current at zero gate bias. These JFET devices can be made at 45 nanometer or smaller line widths.

Speed of operation in switching transistors depends upon the amount of drain current since parasitic and load capacitances coupled to the drain need to be charged and discharged as switching occurs. This charging and discharging changes the voltage on these capacitors to switch transistors on and off. Therefore, larger drain currents allow transistors to operate and switch at higher frequencies. Recently, multi-gate transistors (e.g., double gate, tri-gate, and the like) have been proven to provide such benefits. In a multi-gate device, the channel is surrounded by multiple gates thus allowing improved suppression of off-state leakage current and enhancement of the on-current.

For example, in a Junction Field Effect transistor (JFET), a multi-gate (e.g., double gate) configuration allows enhanced modulation of the depletion region when the gate bias is changed by increasing the volume of the channel depletion that can be modified by the gate. Thus, generally, a double-gate JFET has a faster switching time compared to a single-gate JFET due to a number of factors, one of which includes increased drain current (on-current) from, for example, reduced channel resistance due to decreased channel depletion for the same gate bias.

For JFETs, to control the bias applied to each of the front gate and back gate, separate surface contacts for the front gate and back gate are generally utilized. This double-gate configuration often further necessitates a surface metal interconnect to connect the front gate and back gate contacts.

However, the surface contact to the back gate consumes additional area thus potentially impacting scalability of double-gate devices. For example, the size of the back gate surface contact must typically be large enough to prevent misalignment errors associated with various masks. It is also desirable to make transistors as small as possible so that more can be put on a given size integrated circuit die. This allows ever more complex circuits to be made and more economically as line widths decrease.

There therefore remains a need for a novel double-gate device structure that is not penalized by larger size or area consumption or occupation of the double-gate device as compared to an area size consumed or occupied by a single-gate device and that reduces parasitic capacitance and increases switching speed, especially for sub 100-nanometer line width devices.

BRIEF DESCRIPTION OF THE DRAWINGS

FIG. 2A illustrates an example of a cross sectional view of a shallow trench isolator and the surrounding active regions, according to one embodiment.

FIG. 2B illustrates an example of a cross sectional view of a shallow trench isolator (STI) having cavities formed on the edges adjacent to the active regions, according to one embodiment.

SUMMARY

Figure 1A:
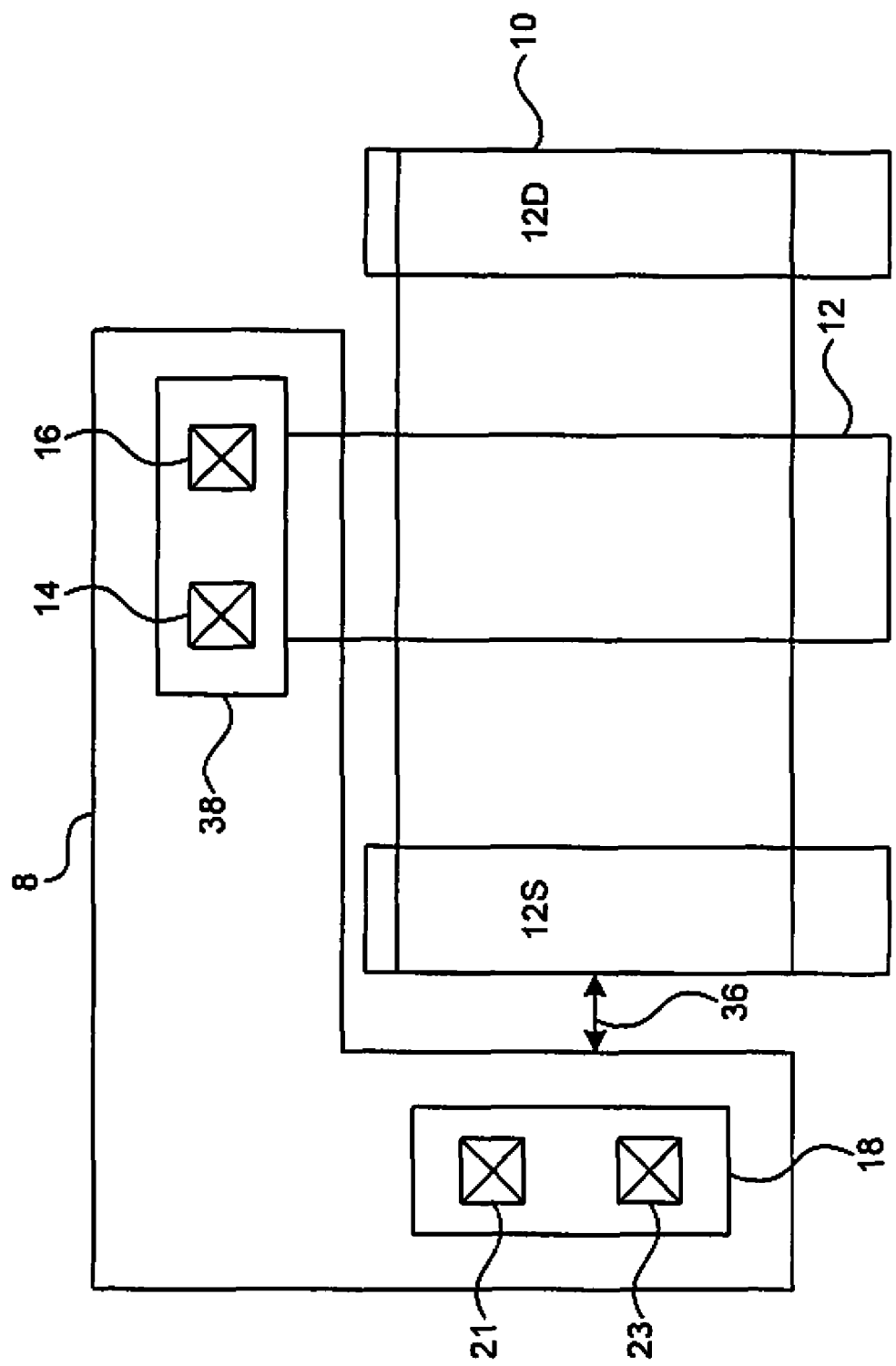
FIG. 1A illustrates a top view of a double-gate JFET device not incorporating the structures or having the advantages of the inventive double-gate transistor.

In one aspect, there is provided double gate JFET with reduced area consumption and a fabrication method therefore.

In another aspect, there is provided a double gate structure for a Junction Field Effect Transistor (JFET), comprising: an active area in a substrate including a doped channel region of a first conductivity type formed in a semiconductor substrate of a second opposite conductivity type to form a PN junction back gate; the active area defined by a Shallow Trench Isolation (STI) trench filled with an insulator or dielectric material which places a region of the insulator or dielectric material under stress at a layer adjacent the trench, the trench surrounding the active area so as to define a perimeter of the active area, the insulator or dielectric having divots etched at the perimeter down to at least a depth such that any conductive material formed in the divots will make electrical contact with the semiconductor substrate of the second conductivity type; a doped polycrystalline silicon gate surface contact formed over the active area and sized so as to extend over the perimeter of the active area at one or more locations; a doped gate region of the second conductivity type and formed in the substrate above the doped channel region and in electrical contact with the gate surface contact, an interface between the doped gate region and the doped channel region forming a PN junction front gate; and a doped polysilicon stringer formed in the portion of the divot under the intersection of the polysilicon gate surface contact and the perimeter of the active area so as to form a double gate structure providing an electrically conductive path between the front gate and the back gate.

In still another aspect, there is provided a A double gate structure for a Junction Field Effect Transistor (JFET), comprising: an active area in a semiconductor substrate having a doped channel therein, the channel formed in a well of opposite conductivity type from the channel to form a PN junction back gate, the active area defined by a Shallow Trench Isolation (STI) trench filled with silicon dioxide which surrounds the active area and defines an active area perimeter, the silicon dioxide having divots etched at the active area perimeter down to at least a depth such that any conductive material in the divots will make electrical contact with the well; a doped polycrystalline silicon gate surface contact formed over the active area and sized so as to extend up to or over the active area perimeter at at least one location; and a doped polysilicon stringer formed in the portion of the divot under an intersection of the polycrystalline silicon gate surface contact and the active area perimeter.

In still another aspect, there is provide a process for making a double gate structure for a Junction Field Effect Transistor, comprising: thermally growing a layer of silicon dioxide (pad oxide) on a silicon substrate; depositing a layer of silicon nitride over the silicon dioxide layer; forming in the silicon substrate, so as to define the perimeter of an active area, a Shallow Trench Isolation trench (STI trench) filled with silicon dioxide deposited by chemical vapor deposition (CVD oxide) at least a portion of which has been densified so that the silicon dioxide is stressed at the edges of the STI trench, and polishing the CVD oxide back to flush with the top of the nitride layer; removing the nitride layer; and etching away the layer of silicon dioxide (pad oxide) with a silicon dioxide etch process that also etches the stressed silicon dioxide at the edges of the STI trench to form divots.

In even still another aspect, there is provided a method for making a double gate Junction Field Effect Transistor (JFET), the method comprising the steps of: forming in a semiconductor substrate a Shallow Trench Isolation Trench (STI), defining an active area of the JFET so as to establish the perimeter of the area; the STI forming comprising growing a liner silicon dioxide on the walls of the STI and filling with an additional dielectric to place the liner silicon dioxide under stress; the active area comprising a channel region of a first conductivity type, and formed in a well of a second conductivity type to form a PN junction back gate; removing at least a portion of the liner silicon dioxide from the walls along the STI trenches, such as to create divots in the silicon dioxide along the edges of the STI along the perimeter of the active area; the removing step comprising etching the liner silicon dioxide down to at least a depth such that any conductive material deposited in the divots will make electrical contact with the well; forming a doped polycrystalline silicon gate surface contact over the active area and sized so as to extend over the perimeter of the active area at one or more locations; forming a doped gate region of the second conductivity type above the channel region and in electrical contact with the gate surface, the interface between the gate and channel regions forming a PN junction front gate; and forming a doped polysilicon stringer in the portion of the divots under the intersection of the gate surface contact and perimeter of the active area, so as to form a double gate structure providing an electrically conductive path between the front and back gates.

It yet another aspect, there is provided a double gate Junction Field Effect Transistor (JFET) comprising: a Shallow Trench Isolation Trench (STI), formed in a semiconductor substrate and defining an active area of the JFET so as to establish the perimeter of the active area; the STI including a liner layer of silicon dioxide formed or deposited on the walls of the STI and filled with an additional dielectric, at least the liner silicon dioxide being under mechanical or crystallographic stress; the active area comprising a channel region of a first conductivity type, and formed in a well of a second conductivity type to form a PN junction back gate; divots formed as depressions in the silicon dioxide along the edges of the STI along the perimeter of the active area; the divots extending down to at least a depth such that any conductive material deposited in the divots will make electrical contact with the well; a doped polycrystalline silicon gate surface contact over the active area and sized so as to extend over the perimeter of the active area at one or more locations; a doped gate region of the second conductivity type above the channel region and in electrical contact with the gate surface, the interface between the gate and channel regions forming a PN junction front gate; and a doped polysilicon stringer in the portion of the divots under the intersection of the gate surface contact and perimeter of the active area, so as to form a double gate structure providing an electrically conductive path between the front and back gates.

In still other aspects there are provided double-gate transistor devices, transistors, and integrated circuits with transistors having structures formed according to the methods and processes described.

DETAILED DESCRIPTION OF EXEMPLARY EMBODIMENTS

The following description and drawings are illustrative and are not to be construed as limiting. Numerous specific details are described to provide a thorough understanding of embodiments of the invention. However, in certain instances, well-known or conventional details are not described in order to avoid obscuring the description.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Although embodiments of the present invention are described with example reference to junction field effect transistors (JFET), the application of the novel aspect of the invention is not limited as such. Applications of the principles of double gate and/or to other multi-gate configuration with area consumption reduction disclosed herein to other types of devices of additional or same materials systems (e.g., Si, Ge, GaAs, other III-V systems, and the like) are contemplated and are considered to be within the scope of this invention, including but not limited to, metal-semiconductor field effect transistors (MESFETs), Ge/Si FETs, and/or any other semiconductor device whereby shallow trench isolators are used to delineate active areas and can provide access to the back gate P-N junction.

Figure 1B:
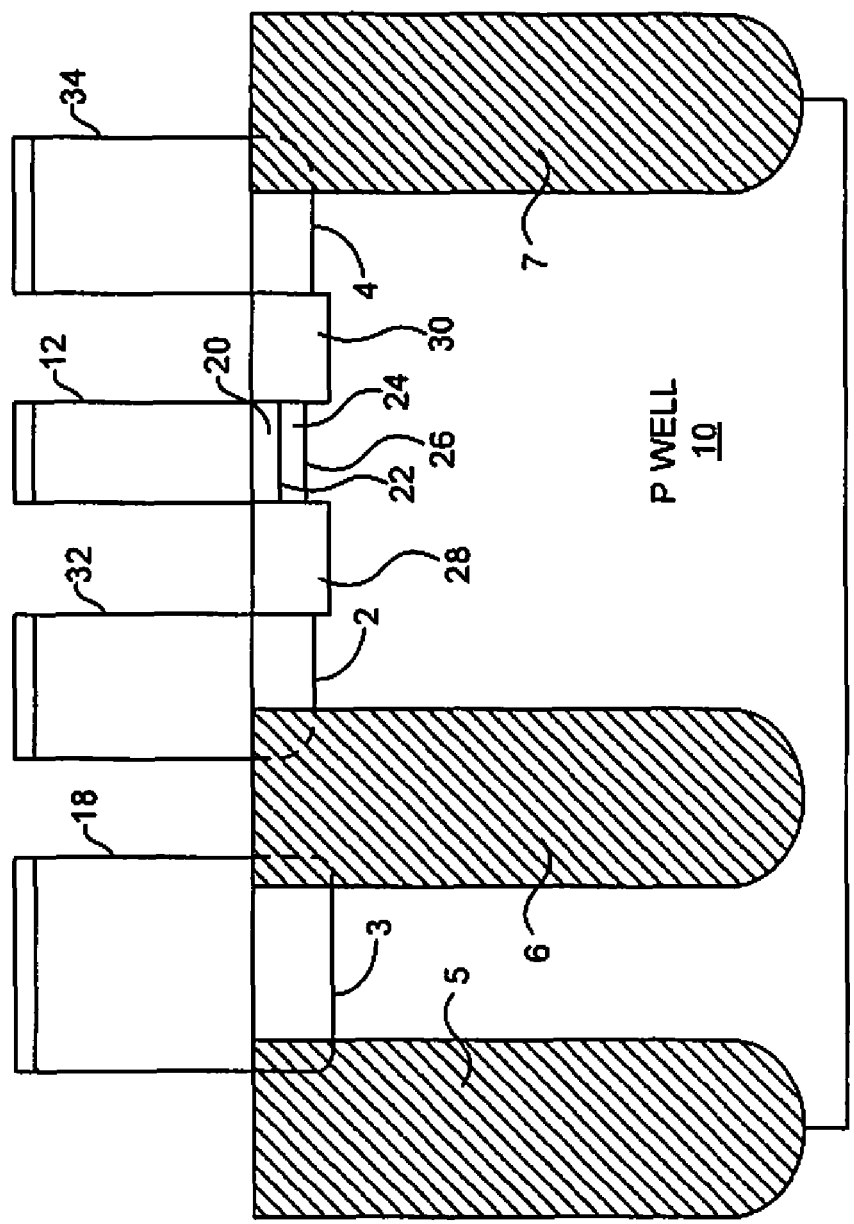
FIG. 1B illustrates a cross section view through the active area of the double-gate JFET in FIG. 1A.

FIG. 1A is a top view of a double-gate JFET's active area according to another one of the applicant-assignee's (DSM Solutions, Inc.) innovations that does not incorporate the structures or provide all of the advantages of the invention described in the Detailed Description herein. FIG. 1B is a cross-section through the active area of the JFET device in FIG. 1A although not necessarily to the same scale. FIG. 1A and FIG. 1B show (structures are illustrated in FIG. 1A and others in FIG. 1B) contact holes 14 and 16 for the gate surface contact 12 and a separate active area (the portion of the P well 10 between STI trenches 5 and 6) and surface contact 18 and contact holes 21 and 23 for the back gate (PN junction 26). The JFET active area 10 has stripes of polycrystalline silicon (polysilicon) 12, 12s and 12d crossing it to form the gate, source and drain surface contacts, respectively. Contact holes 14 and 16 are formed through an overlying insulator layer (not shown) to this polysilicon layer 12 so that an overlying metal layer will make contact with the polysilicon 12 to allow the gate to be coupled to other nodes in the circuit. An adjunct portion of active area 10 (the portion of the P well 10 between STI trenches 5 and 6) is brought to the surface so that a polysilicon back gate surface contact 18 may be formed for purposes of providing a surface contact to the back gate. The polysilicon gate surface contact 12 makes contact with the front gate 20 which forms PN junction 22 with channel region 24.

The channel region 24 forms a PN junction 26 (referred to herein as the back gate) with a P well 10 which is defined by Shallow Trench Isolation (STI) trenches 6 and 7 which define the perimeter of the main portion of the active area. Source and drain regions 2 and 4, coupled to the channel through highly doped link regions 28 and 30 form a conductive path from source contact 32 to drain contact 34 through the channel 24. Depletion regions around PN junctions 22 and 26 control whether the channel 24 is pinched off such that no drain current flows or not pinched off such that drain current does flow. The sizes of these depletions regions or, more precisely, the doping concentration of the gate region 20 and the channel region 24 and the junction depths of PN junctions 22 and 26 control whether the portion of the depletion region below PN junction 22 meets the portion of the depletion region above PN junction 26.

If the two depletion regions meet at zero gate bias, the channel is pinched off and the device is called an enhancement mode device, and no drain current flows regardless of the drain voltage. The sizes of these depletion regions are controlled, among other things, by the biases applied via the surface contacts 12 and 18 to the front and back gates (PN junctions 22 and 26). An adjunct portion of the P well 10 is defined by Shallow Trench Isolation trenches 5 and 6 to extend to the surface so that a surface contact 18 and ohmic contact 3 may be formed so that bias can be applied to the back gate 26.

It is advantageous in JFETs to operate the device with both a front gate (PN junction 22 in FIG. 1B) and back gate having the same voltage applied thereto. Double gate operation gives substantially more drive current at 0.5 volts gate bias for the same leakage current. More drive current means faster switching operation because parasitic capacitances that need to have their charge levels change in order to change the voltage on a node can have their charge levels changed faster if more drive current flows. Double gate operation allows better control of the depletion regions so that more volume in the channel can be opened up when the device is turned on. The device operating in double gate operation will operate faster in proportion to the increase in drain current. More volume in the channel in a non-pinched off state also reduces the resistivity and provides greater drain current.

To achieve control of the biases applied to each of the front gate and back gate, current JFET designs utilize separate surface contacts 12 and 18 for the front and back gate and a surface metal interconnect 8 to connect the front gate and back gate contacts together.

The problem with such designs is that the surface contact to the back gate takes up extra area at each transistor location. For example, the entire area of the metal interconnect 8 is consumed. In addition spacing 36 must be maintained according to the design rules so that the surface contact 18 does not overlap the main active area 10. In addition, the sizes of the back gate contact holes 21 and 23 are typically dictated by the minimum line widths, and the size of the back gate surface contact 18 must be large enough to prevent misalignment errors between the mask for contact holes 21 and 23 and the mask for the surface contact 18. In addition, the size of the metal interconnect must be such as to prevent misalignment errors between its mask and the surface contact 18 and the pad 38 for the front gate contact holes.

Semiconductor devices such as Junction Field Effect (JFET) Transistors formed according to the principles and processes described herein may overcome the problems and limitations of the conventional devices described hereinabove. For example, exemplary double-gate JFET transistor device built according to the double gate technology disclosed provides more than double (2×) the drive current at 0.5 volts drain voltage for the same leakage.

As described in more detail below with particular reference to the drawings, one non-limiting embodiment uses over-etched divots or cavities filled with doped polysilicon under the polysilicon gate contact where the doped polysilicon in the divots or cavities forms an electrical path between a JFET front gate and a back gate such that they both have the same bias voltage. A feature of some embodiments is increased drain current and faster operation without an substrate area penalty conventionally imposed by surface contacts for the back gate and a separate adjunct active area.

One non-limiting exemplary process to form or make the double gate structure involves forming divots by etching divots selectively or globally in the STI oxide along the active edges of the STI at the perimeter of and facing the active area in which a JFET transistor is to be built and then filling these divots with doped polysilicon from the gate electrode. The divots or cavities are etched deep enough to exceed the depth of the channel-well PN junction, also referred to as the back gate. More precisely, these divots are etched in stressed CVD oxide that fill Shallow Trench Isolation trenches filled with CVD oxide which has been densified in some embodiments. The densification process causes the CVD oxide to expand and push against the walls of the STI trenches and causes stress in the CVD oxide at the STI trench wall. The stress in the CVD oxide causes its etch rate to be higher than the etch rate of thermal pad oxide grown on the surface of the silicon substrate. When the pad oxide is etched, the divots are formed. When they are filled with doped polysilicon under the polysilicon gate surface contact, if the divots are deep enough to reach the well under the channel, the back gate will be electrically connected to the front gate because the doped polysilicon in the divot under the gate surface contact will be an extension of the polysilicon gate surface contact and will make electrical contact with the well under the channel region.

The process to form the STI trenches in at least one non-limiting embodiments starts with a thermal bake of a single crystal to grow a thin layer of pad oxide followed by deposition of silicon nitride. The STI trenches are then etched through these two layers, and a layer of thermal oxide is grown on the walls of the trenches before they are filled with CVD oxide. Other or different insulator materials than CVD silicon oxide that may be applied or processed to create a stress as described herein below may be used. A channel implant can be done either before or after the formation of the STI trenches. In some embodiments, the channel implant is done before the divots are etched so that it is known how deep the divots should be formed. In other non-limiting embodiments, the trenches are etched so as to be deep enough for the desired channel doping profile and then the channel implant is done using energy levels which will cause a doping profile and channel depth which does not exceed the depth of the divots. The nitride layer is then removed and the pad oxide is etched away. The time of the pad oxide etch is set so that considering the etch rate of the stressed CVD oxide at the edge of the active area, the etch removes enough of the CVD oxide at the edges of the STI trench to form a divot that extends down to the well under the channel. A layer of polysilicon is then deposited, doped by ion implantation and patterned and anisotropically etched to form the polysilicon gate contact that runs across the top of the active area and intersects its perimeter at least one point. The deposition of the polysilicon fills the divots all around the active area. The anisotropic etch may advantageously be carried out to both define the shape of the polysilicon gate contact and remove the polysilicon from the divot locations everywhere except under the intersection of the polysilicon gate stripe and the perimeter of the active area. The anisotropic etch is optionally but advantageously monitored to make sure any polysilicon stringers are removed from the divot locations outside polysilicon gate stripe to avoid an inadvertent short circuit.

Dielectric spacers may optionally but advantageously be formed around the edges of the polysilicon gate contact and the rest of the device may be formed in any one of a number of different processes to form metal silicide source and drain contacts or polysilicon source and drain contacts, and the like. The optional dielectric spacers make silicide formed on the surface of the substrate over the source and drain areas self-aligned with the edges of the spacers. Metal source and drain contacts with barrier layer metal at the bottoms may fill contact holes formed in a dielectric layer that covers the entire wafer, with the contact holes going all the way down to the silicide.

In at least one non-limiting embodiment, the gate structure which provides JFET double gate operation without back gate surface contact area being consumed may include the afore described divots or cavities formed in the STI oxide and filled with doped polysilicon under the polysilicon gate surface contact but not elsewhere. The divots or cavities at the perimeter edges of the STI trenches extend down the sidewalls of the STI trenches far enough to reach the well under the channel such that electrical contact between the front gate and back gate is established. Other portions and substructures of the JFET may be conventional or have novel aspects and it will be appreciated that any JFET that includes the novel gate structure will also be novel. In at least some non-limiting embodiments, dielectric spacers may be formed if metal source and drain contacts to silicide layers on top of the source and drain regions are to be used.

Attention is first directed to exemplary structures and then to exemplary processes for forming such structures.

FIG. 2A illustrates an example of a cross sectional view 100 of a shallow trench isolator and the surrounding active regions, according to one embodiment.

The shallow trench isolator 112 is formed in a trench region 108 formed in the substrate 106. For example, the trench region 108 is formed from etching the substrate 106 (e.g., silicon substrate or silicon-on-insulator (SOI) substrate). The active region includes a well region 104 and a channel region 102 of implanted impurities of the appropriate conductivity type. For example, an n-channel device has a p-well. A p-channel device has an n-well.

The shallow trench isolator (STI), in one embodiment, includes a layer of thermal oxide 110 (e.g., thermally grown silicon dioxide) coating the trench edge and filled with an oxide such as a CVD oxide 112 (e.g., silicon dioxide deposited by Chemical Vapor Deposition (CVD)). In some instances, thermal oxide layer 114 may be grown and silicon nitride 116 may be deposited prior to trench etching. The CVD oxide 112 deposition may be polished after deposition for alignment with the nitride layer 116.

In one embodiment, the CVD oxide deposition 112 is densified at a high temperature. In one embodiment the densification may take place at a temperature of from about 950 C to 1200 C, AND typically at 1100 C, in inert $N_2$ (Nitrogen gas) ambient condition. The increase in CVD oxide 112 density causes a change in volume thus exerting stress in the adjacent thermal oxide 110 and substrate areas 106. The stress in the thermal oxide 110 causes the thermal oxide etch rate to be faster than the etch rate of the CVD oxide. For example, the thermal oxide 110 has been demonstrated to etch at a rate that is between about 1.1-3× faster and more typically between about 1.1-2× faster, and even more usually between about 1.5 and 2× faster, than un-stressed oxide. CVD oxide and when present a liner thermal oxide may also etch at somewhat different rates as compared to the pad oxide but these differences when present are within a range that can be tuned by process parameters. The difference in etch rate advantageously results in formation of cavities or divots at the sidewalls of the STI where the thermal oxide 110 contacts the substrate 106 since the thermal oxide 110 etches faster. The STI cavities or divots 116, 118 resulting from etch rate variation are illustrated with further reference to FIG. 2B. Note that two cavities or divots are described relative to the cross sectional view in many of the drawings, but it will be appreciated that this may actually by a single divot or cavity that is formed on the perimeter of a single STI trench and so it may be more accurately characterized as a single cavity or divot. Other or different insulator materials than CVD silicon oxide that may be applied or processed to create a stress as described herein elsewhere and that exhibit a differential etching rate may alternatively be used.

FIG. 2B illustrates an example of a cross sectional view 150 of a shallow trench isolator (STI) 112 having cavities or divots 116 and 118 formed on the edges adjacent to the active regions, according to one embodiment. Henceforth, these cavities or divots will be referred to as cavities for the purpose of brevity of expression.

In one embodiment, the shallow trench isolation region 112 has a cavity 118 at an edge adjacent to the active region. The depth of the cavity extends below the P-N junction 103 between the channel 102 and the well region 104 such that the well region 104 is accessible. For example, etching the STI 112 below the P-N junction 103 allows the well region 104 to be electrically coupled to the surface of the device (e.g., during poly-gate deposition).

Figure 3A:
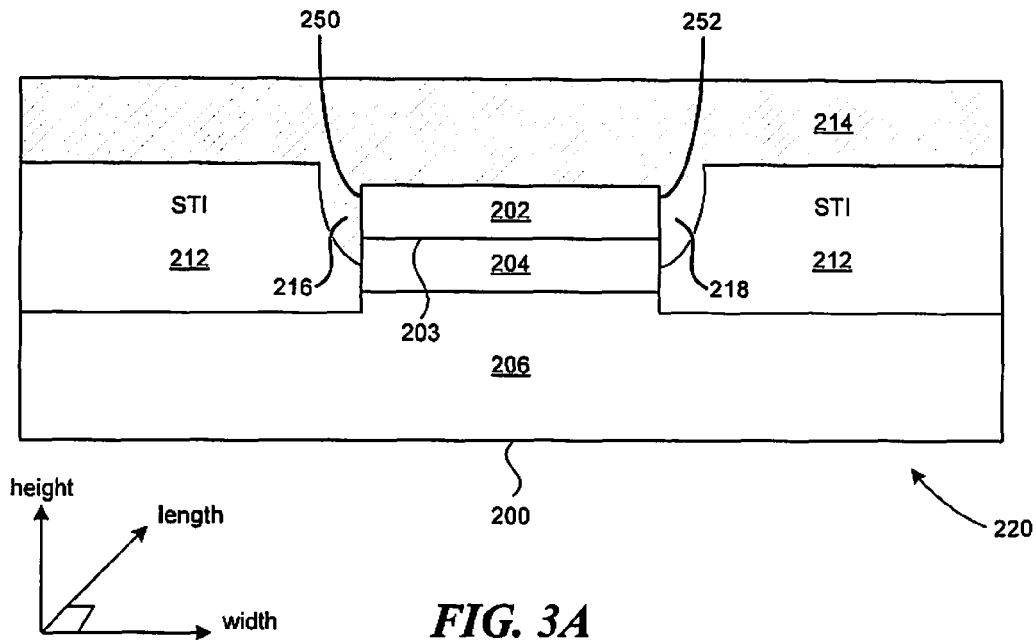
FIG. 3A illustrates an example of a cross sectional view along the width of a junction field-effect transistor (JFET) with reduced area double gate access having polysilicon filled STI cavities that allow the gate electrode region to access the back gate through the cavities, according to one embodiment.

FIG. 3A illustrates an example of a cross sectional view 200 along the width of a junction field-effect transistor (JFET) 200 with reduced area double gate access having polysilicon 214 filled STI cavities 216 and 218 that allow the gate electrode region to access the back gate 203 through the cavities 216 and 218, according to one embodiment.

The width of the JFET 200 extends perpendicular to the length of the device spanning between the source and drain regions (not visible). The JFET 200 includes a channel region 202, a well region 204, a substrate 206, and the STI 212, which are visible in the cross sectional view 200 along the device width.

The STI 212 is structurally similar to that of STI 112 in the example described relative to FIG. 2A, but with some differences. In one example embodiment, the STI 212 comprises a layer of thermal oxide coating the edges and is deposited with CVD oxide that is subsequently densified by heat. The CVD oxide densification induces stress in the adjacent material (e.g., substrate 206 and/or the thermal oxide regions of the STI). The stress causes the thermal oxide in the STI to etch faster thus advantageously forming cavities (e.g., cavities 216 and/or 218) at the STI edges. The cavities 216 and/or 218 having a depth below the P-N junction 203 between the channel 202 and the well 204 along the substrate 206 length at the channel edges 250, 252, facilitate electrical coupling of the gate electrode region and the well region 204.

In one non-limiting embodiment, the depth of the cavity is approximately 10 nm below the P-N junction +/−1%-10%. In alternate non-limiting examples, the depth may be 5, 15, 20, 25, 30, 35, 40, 45, 50, 60, 70, 80, 90, 100, 150, or 200 nm deep (or any intermediate value between these values) and an appropriate depth below the P-N junction. Deeper cavities typically require deeper trench depth, and typical trench depths are usually lees than about 300 nm, and more typically less than 270 nm, though these are not limitations of the invention. When the trench depths are less than about 300 nm, the cavity or divot depth is usually less than about 150 nm. For example, the front and back gates can be electrically coupled when polysilicon layer 214 is deposited over the JFET 200 filling cavity 216 and/or 218. By coupling the front and back gates, double gate operation can be achieved. In one embodiment, the gate electrode region formed by polysilicon deposition 214 is also deposited in the one or more of the cavities 216 and 218 and can be electrically coupled. In one non-limiting embodiment, the polysilicon layer 214 may be substantially 50 nm in thickness but thickness in the range between about 30 nm and about 200 nm may alternatively be used. The polysilicon 214 depth may be any quantity that sufficiently fills the STI cavities 216 and/or 218.

In one embodiment, the JFET 200 does not include a well region 204 and the channel region 202 is formed in the substrate 206. In general, for an nJFET, the channel region 202 is doped with n-type impurities and the substrate 206 is doped with p-type impurities. For a pJFET, the channel region 202 is doped with p-type impurities and the substrate 206 is doped with n-type impurities. The area consumption of a double gate JFET without a well region (not shown) can be reduced in accordance with the novel techniques introduced in the embodiments herein described. For example, back gate access can be obtained by forming STI cavities at channel edges 250/252 along the length of the substrate 206. By forming cavities with depths exceeding that of the P-N junction between the channel region 202 and the substrate 206, the front gate polysilicon deposition can be electrically coupled to the back gate polysilicon.

Figure 3B:
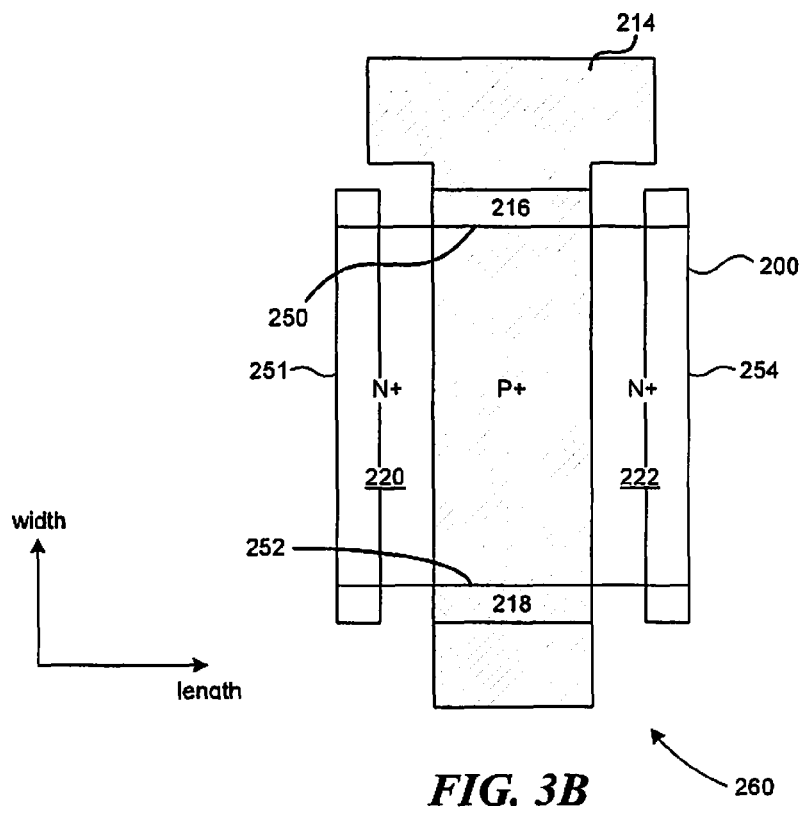
FIG. 3B illustrates a top view of an n-type junction field-effect transistor (nJFET) showing the location of the polysilicon filled STI cavities relative to the gate polysilicon and the source/drain regions, according to one embodiment.

FIG. 3B illustrates a top view 260 of the n-type junction field-effect transistor (nJFET) 200 showing the location of the polysilicon filled STI cavities 216 and 218 relative to the gate polysilicon 214 and the source region 220/drain region 222, according to one embodiment.

The channel (not shown) is disposed between and in contact with the source region 220 and the drain region 222 along the substrate length. Further, the channel extends along a width of the substrate between a first shallow trench isolation region at the first channel edge 250 and a second shallow trench isolation region at the second channel edge 252. In particular, the STI cavities 216 and/or 218 are formed at the first and second channel edges 250 and/or 252. When the depth of the STI cavities 216 and/or 218 exceeds the P-N junction (e.g., between channel and well or between channel and substrate for a device with a well implant), polysilicon 214 can fill the cavities 216 and/or 218. Polysilicon filled STI cavities 216 and/or 218 can, in one embodiment provide back gate access (e.g., well region or substrate region) and enable double gate operation of JFET 200. Back gate access via STI cavities 216 and/or 218 generally reduces the area consumption of a double gate JFET. In non-limiting embodiments, the area consumed is reduced by more than two times (2×) compared to back gate surface contact.

It may be noted that the STI cavities formed at source edge 251 and drain edge 254 do not need to contain gate electrode polysilicon to achieve double-gate configuration, in accordance with embodiments of the novel techniques herein introduced. The source edge 251 and drain edge 254 STI cavities are illustrated with further reference in a cross sectional view along the length of a JFET in FIG. 4A.

Figure 4A:
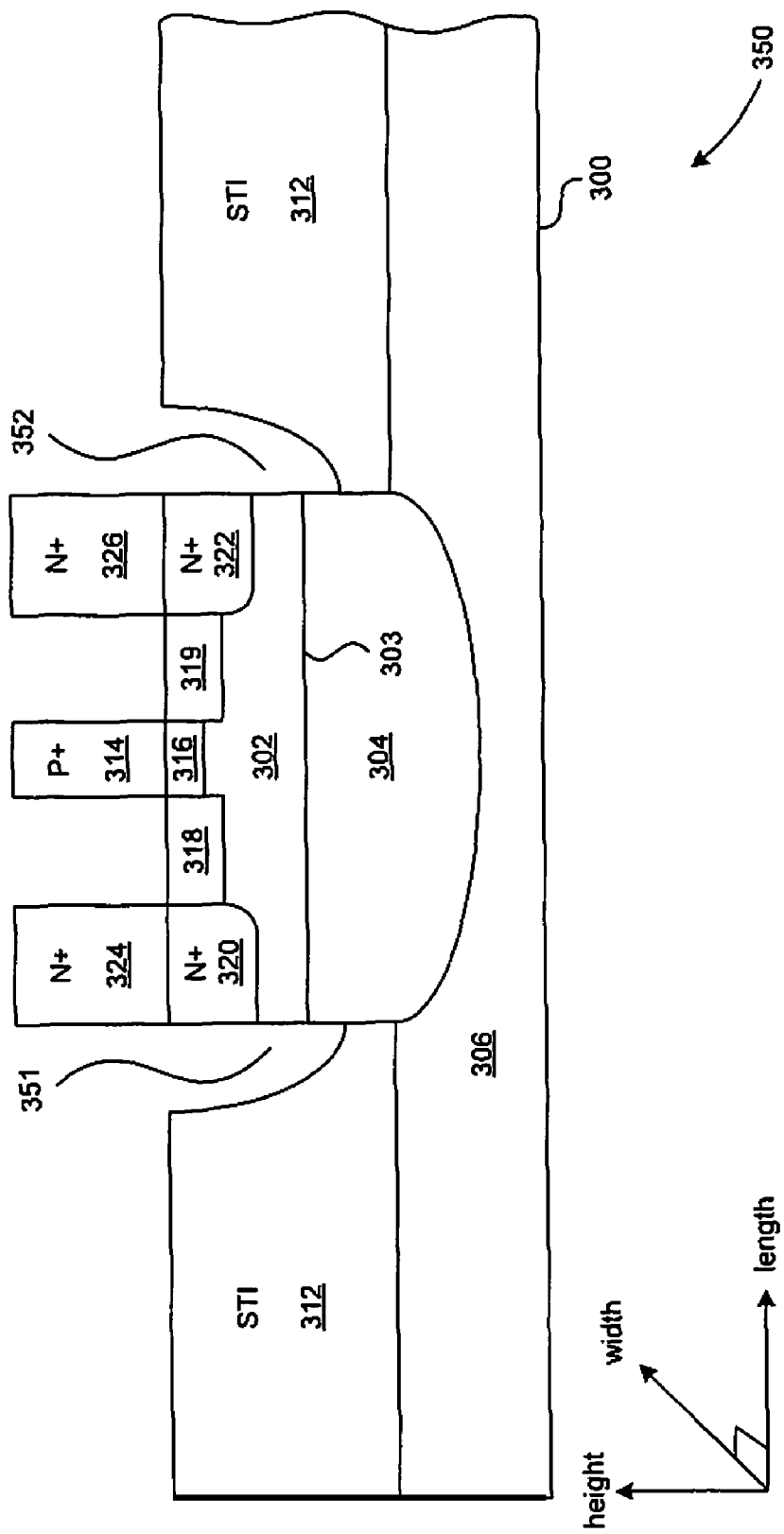
FIG. 4A illustrates a cross sectional view along the length of a double-gate nJFET with reduced area consumption having STI cavities that are not polysilicon filled, according to one embodiment.

FIG. 4A illustrates a cross sectional view 350 along the length of a double-gate nJFET 300 with reduced area access having STI cavities 351 and 354 that are not polysilicon filled, according to one embodiment.

The nJFET 300 may be fabricated from any known and/or convenient methods on an n-type (or p-type) substrate. The substrate is typically silicon or a silicon containing material but is not limited to silicon or to a silicon containing material. The substrate could also be silicon-on-insulator (SOI). In some instances, the active area of the nJFET 300 is defined by Shallow Trench Isolation (STI) trenches 312. Typically the STI 312 defines an active area over which the source, drain, and gate surface contacts are deposited.

The nJFET 300 also includes a source electrode 324, a drain electrode 326, and a p-type gate region 316 coupled to a gate electrode 314. In one embodiment, the source, drain, and/or gate electrodes are highly doped polysilicon (e.g., P+ for nJFET). In addition, the source, drain, and/or gate contacts may be metal contacts, as illustrated with further reference to FIG. 5. Silicide (not shown) may also be formed on the polysilicon contacts for conductivity enhancement.

In one embodiment, STI cavities formed along the first channel edge and second channel edge (e.g., similar to channel edges 250 and 252 of FIG. 3B) are deposited with p-type polysilicon 314 extending the gate electrode region 314 to the back gate (e.g., the P-N junction 303 between the channel/well or the P-N junction between the channel/substrate in a device without well implants). A double gate JFET with back gate access via STI cavities along the channel edges allows double-gate operation with reduced area consumption. In some instances, the gate region 314 has insulating sidewall spacers on each side (not shown) which may include a layer of silicon dioxide and in some instances, an additional layer of silicon nitride.

Note that in the double gate JFET 300, the source edge STI cavity 351 and the drain edge STI cavity 354 are not filled with gate region polysilicon 314 or otherwise have had polysilicon or other unwanted cavity depositions removed. For an nJFET 300, the p-type gate polysilicon in cavities 351 and/or 354 may become n-doped during the n-type source/drain implants therefore forming parasitic junction capacitance. This may occasionally result in undesired junction capacitance created by unwanted polysilicon stringers. There will never be a short between gate/source or gate/drain. In the case of a polysilicon stringer, an unwanted junction may be formed. This adds to additional gate/source and/or gate/drain capacitance. But area reduction advantage in this example embodiment outweighs the possible the increased capacitance. The n-doped polysilicon in the cavities may also form a diode with the p-well 304. Additional junctions, such as a diode junction, may cause higher capacitance and leakage, but again the area reduction and other advantages out weight these effects.

The nJFET 300 may include a p-well region 304 in which the n-channel 302 is formed. The channel region 302 (e.g., p-channel) may be formed along the length of the substrate 306 between the source region 320 and the drain region 322. The depth of the channel is typically, but not limited to, 50-500 angstroms (5 to 50 nm). Shallow channels are preferred, especially for 65 nm, 45 nm, and smaller technology nodes or design rules. The channel depth may be, for example, but is not limited to 30 Å, 40 Å, 50 Å, 60 Å, 75 Å, 100 Å, 150 Å, 175 Å, 200 Å, 250 Å, 300 Å, 350 Å, 400 Å, 450 Å, or 500 Å or to any value intermediate between the recited values. In addition, the nJFET 300 may include link regions 318 and/or 319. In non-limiting embodiments, typical well depths may be in the range from about 100 nm to about 400 nm, and more usually in the range from about 200 nm to about 350 nm.

Figure 4B:
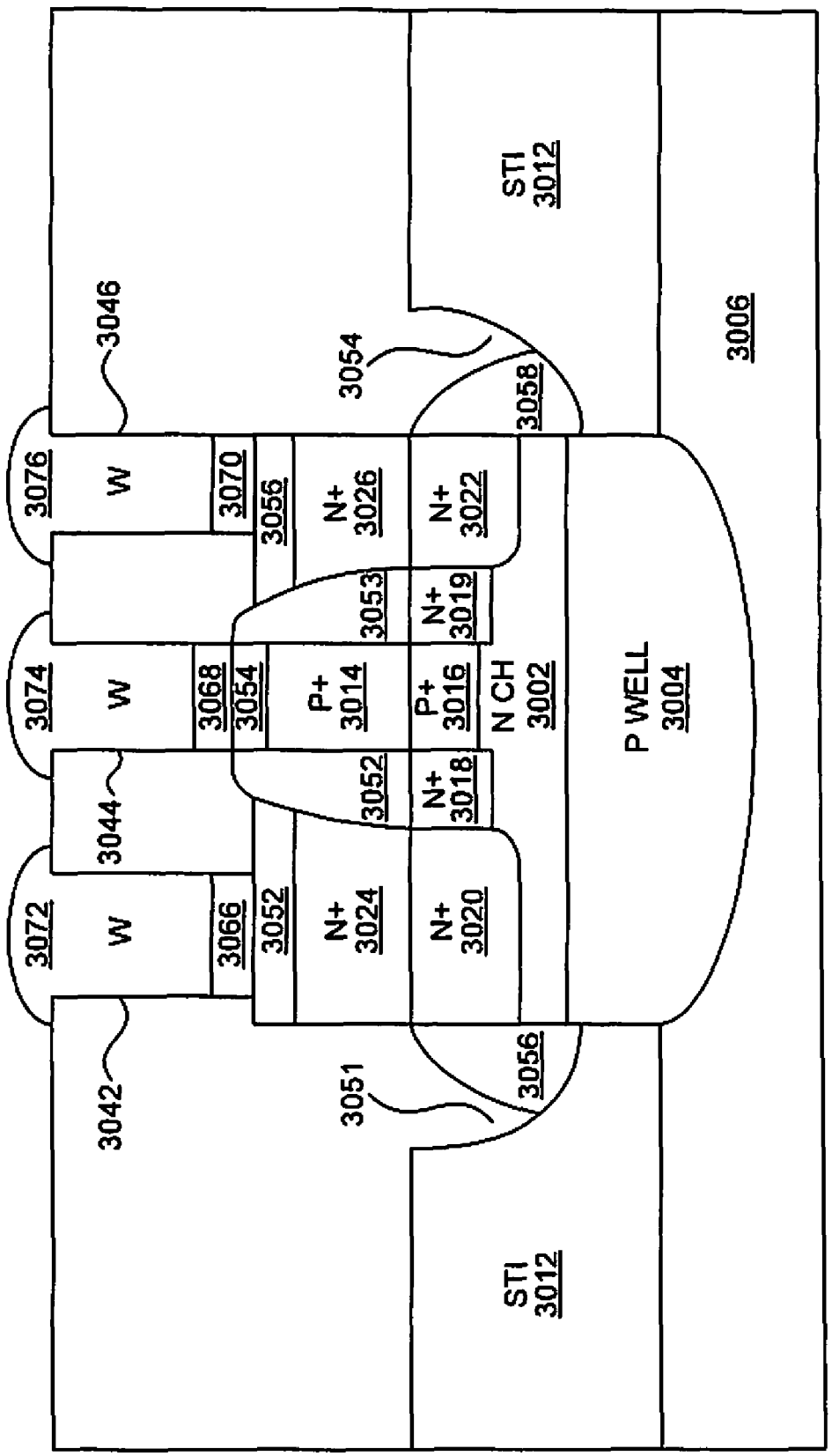
FIG. 4B illustrates a cross sectional view along the length of a double-gate nJFET with reduced area consumption having STI cavities and spacers, according to one embodiment.

FIG. 4B illustrates a cross sectional view 3050 along the length of a double-gate nJFET with reduced area consumption having STI cavities and spacers, according to one embodiment.

The JFET 3000 includes STIs 3012, a source region 3020, a drain region 3022, and a channel 3002. The source, drain, and channel regions are n-type for an nJFET and p-type for a pJFET. In one embodiment, the source, drain and channel regions are formed in an optional well 3004 (p-type for nJFET and n-type for pJFET) in the substrate 3006. In alternate embodiments, the well 3004 may not be included.

The JFET 3000 also includes a gate region 3016, which is p-type (e.g., typically P+) for an nJFET and n-type (e.g., typically N+) for a pJFET. In some example embodiments, the gate contact 3014 has optional insulating sidewall spacers 3052/3053 on each side which may include an optional layer of silicon dioxide and in some instances, an optional additional layer of silicon nitride.

The JFET 3000 optionally includes link regions 3018 and 3019 coupling the gate region 3016 to the source 3020 and drain region 3022, respectively.

The exemplary nJFET 3000 also includes polysilicon source 3024, drain 3026, and gate contacts 3014. A layer of silicide (3052, 3054 and 3056) is optionally formed on the polysilicon contacts for conductivity enhancement.

A layer of barrier metal (e.g., Ti/TiN, 3066, 3068, and 3070) is optionally deposited in the contact holes 3042, 3044, and/or 3046 and thereafter, filled with tungsten (W). Ti/TiN barriers have the benefit of preventing the metallic material in the contact hole from diffusing into the substrate 3006 potentially shorting the source 3020 and drain regions 3022 to the channel 402.

Note that in the exemplary double gate JFET 3000, the source edge STI cavity 3051 and the drain edge STI cavity 3054 are not filled with gate region polysilicon 3014 or otherwise have had polysilicon or other unwanted cavity depositions removed. In one embodiment, the side wall spacers 3056/3058 are deposited in the STI cavities 3051/3054 during deposition of the gate contact 3014 sidewall spacers 3052 and 3053. The side wall spacers 3056/3058 in the STI cavities can protect any remaining polysilicon from silicidation and can eliminate direct source between gate/source or gate/drain.

In one embodiment, the side wall spacers 3056/3058 are formed by depositing a layer of silicon dioxide and a layer of silicon nitride. The layer of silicon nitride and silicon dioxide can subsequently be etched to form dielectric spacers that protect the vertical edges of the polysilicon gate surface contact and the vertical edges of said active area in the STI cavities 3051/3054 (e.g., "divots") not filled by polysilicon.

Methods for operating a JFET (nJFET and/or pJFET) and the related principles of operations (e.g., in the enhancement mode and the depletion mode) are acknowledged by those skilled in the art and are not further described here. In one embodiment, the nJFET operates in the enhancement mode, or otherwise referred to as the normally-off mode. The novel semiconductor devices and structures operating in these modes have enhanced operating characteristics and performance over conventional devices and structures, including by way of example, but not limitation, reduced area consumption of a double-gate configuration, higher drain current, faster switching time, and other implications thereof. It may be appreciated in light of the description provide here that double gate and multi-gate JFETs offer higher ON current at same OFF current as single-gate JFETs. Double gate JFETs also show improved sub-threshold slopes compared single gate JFETs.

Figure 5:
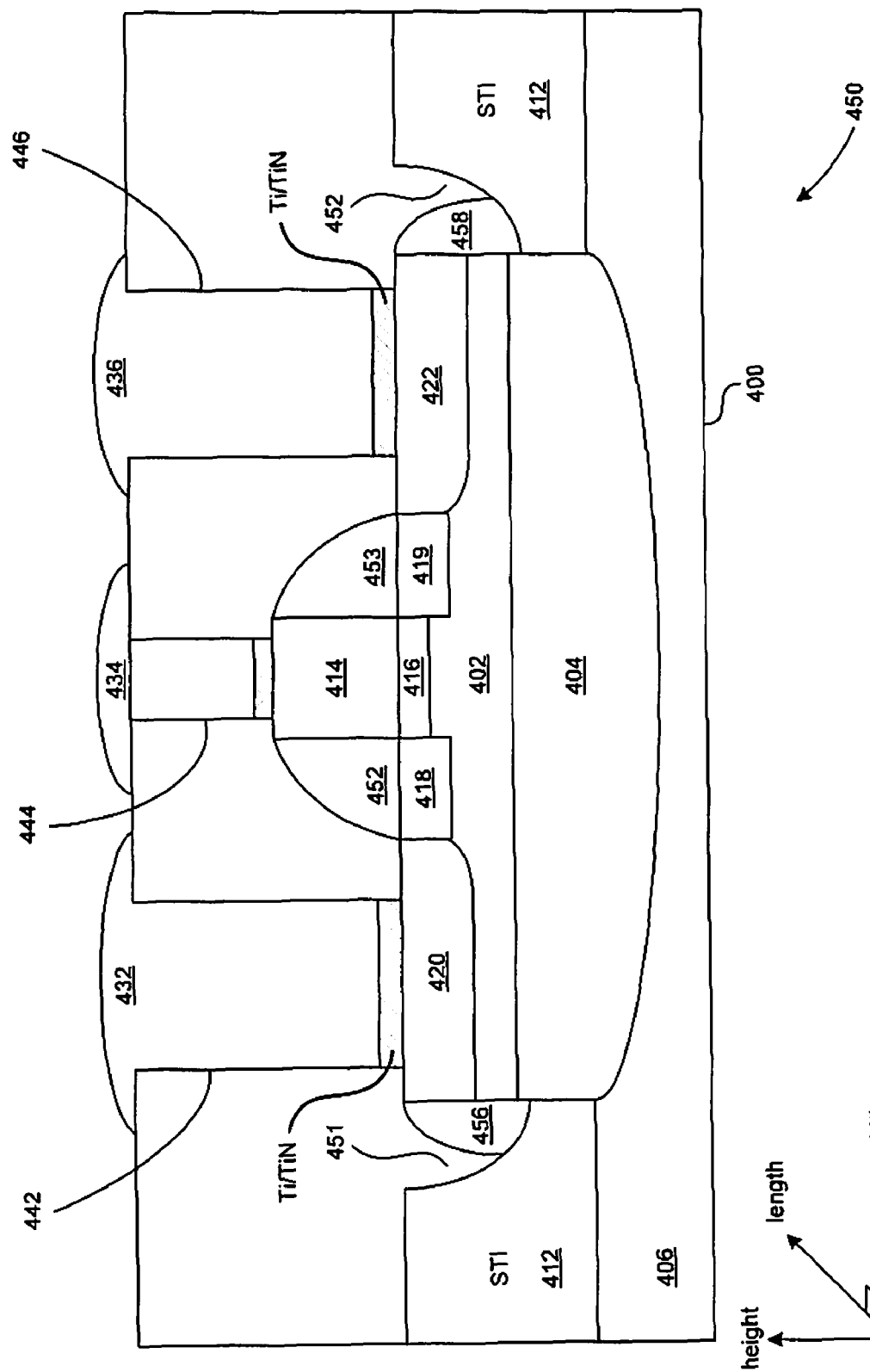
FIG. 5 illustrates a cross sectional view along the length of a double-gate JFET with metallic contacts and reduced area, according to one embodiment.

FIG. 5 illustrates a cross sectional view 450 along the length of a double-gate JFET 400 with metallic contacts and reduced area, according to one embodiment.

The JFET 400 includes STIs 412, a source region 420, a drain region 422, and a channel 402. The source, drain, and channel regions are n-type for an nJFET and p-type for a pJFET. In one embodiment, the source, drain and channel regions are formed in an optional well 404 (p-type for nJFET and n-type for pJFET) in the substrate 406. In alternate embodiments, the well 404 may not be included.

The JFET 400 also includes a gate region 416, which is p-type (e.g., typically P+) for an nJFET and n-type (e.g., typically N+) for a pJFET. In some example embodiments, the gate contact 414 has optional insulating sidewall spacers 452/453 on each side which may include an optional layer of silicon dioxide and in some instances, an optional additional layer of silicon nitride.

The JFET 400 optionally includes link regions 418 and 419 coupling the gate region 416 to the source 420 and drain region 422, respectively.

The exemplary nJFET 400 also includes metallic source 432, drain 436, and gate contacts 434. The contacts may be formed from copper or aluminum although other types of metals may be used. A layer of barrier metal (e.g., Ti/TiN) is optionally deposited in the contact holes 442, 444, and/or 446 and thereafter, filled with tungsten (W). Ti/TiN barriers have the benefit of preventing the metallic material in the contact hole from diffusing into the substrate 406 potentially shorting the source 420 and drain regions 422 to the channel 402.

It may be noted that in the exemplary double gate JFET 400, the source edge STI cavity 451 and the drain edge STI cavity 452 are not filled with gate region polysilicon 414 or otherwise have had polysilicon or other unwanted cavity depositions removed. In one embodiment, the side wall spacers 456/458 are deposited in the STI cavities 451/452 during deposition of the gate contact 414 sidewall spacers. The side wall spacers 456/458 in the STI cavities can protect any remaining polysilicon from silicidation and can eliminate direct source between gate/source or gate/drain.

Methods for operating a JFET (nJFET and/or pJFET) and the related principles of operations (e.g., in the enhancement mode and the depletion mode) are acknowledged by those skilled in the art and are not further described here. In one embodiment, the nJFET operates in the enhancement mode, or otherwise referred to as the normally-off mode. The novel semiconductor devices and structures operating in these modes have enhanced operating characteristics and performance over conventional devices and structures, including by way of example, but not limitation, reduced area consumption of a double-gate configuration, higher drain current, faster switching time, and other implications thereof. It may be appreciated in light of the description provide here that double gate and multi-gate JFETs offer higher ON current at same OFF current as single-gate JFETs. Double gate JFETs also show improved sub-threshold slopes compared single gate JFETs.

Figure 6A:
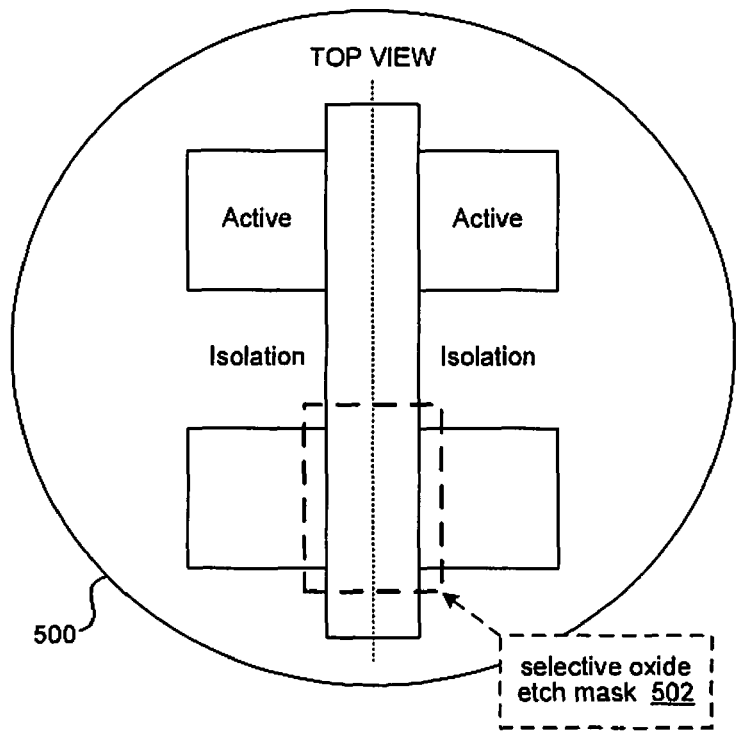
FIG. 6A illustrates an example mask for selective oxide removal to create STI cavities where reduced area double gate JFETs are to be formed, according to one embodiment.

FIG. 6A illustrates an example mask 502 for selective oxide removal to create STI cavities where reduced area double gate JFETs are to be formed, according to one embodiment.

One embodiment includes, an integrated circuit comprising a plurality of transistors, the plurality of transistors including a double-gate transistor. The double-gate transistor includes, a substrate having a shallow trench isolator region comprising a first shallow trench isolator (STI) and a second shallow trench isolator (STI), a channel region having a first channel edge and a second channel edge. The channel region formed in the substrate and disposed between and in contact with the first STI and the second STI at the first channel edge and the second channel edge. The first STI has a first cavity at the first channel edge, and the second STI has a second cavity at the second channel edge. The double-gate transistor further includes, a gate electrode region comprising conductive material filling at least one of the first cavity and the second cavity. At least one of the first cavity and second cavity is physically configured to provide electrical coupling of the gate electrode region to a back-gate P-N junction.

The double-gate transistor in the integrated circuit may be defined by a mask, such as the mask 502. The mask 502 allows definition of STI cavities enabling double gate operation to be formed in select JFETs on die 500. The mask 502 defines a window over an active area where double gate JFETs with reduced area is to be fabricated. This mask 502 can be opened in the photo-resist process to allow STI cavities having a depth reaching the back gate (e.g., P-N junction between the channel/well region or between the channel/substrate region) to be formed in select regions of the die 500.

Figure 6B:
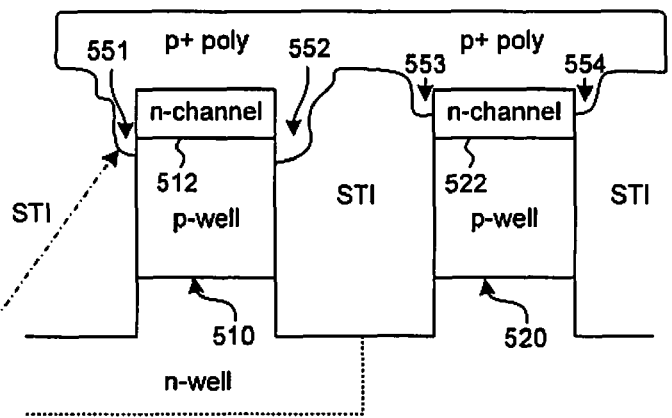
FIG. 6B illustrates an example cross sectional view of a single gate JFET and a reduced area double gate JFET formed via a selective mask, according to one embodiment.

FIG. 6B illustrates an example cross sectional view of a single gate JFET 520 and a reduced area double gate JFET 510 formed via a selective mask 502 on the die 500, according to one embodiment. The double gate JFET 510 includes STI cavities 551 and 552 that are deeper than the P-N junction 512 between the channel and the well. Contrastingly, the single gate JFET does not include STI cavities (not shown) or includes cavities (e.g., cavities 553 and/or 554) that are shallower in depth than that of the P-N junction 522.

Figure 7:
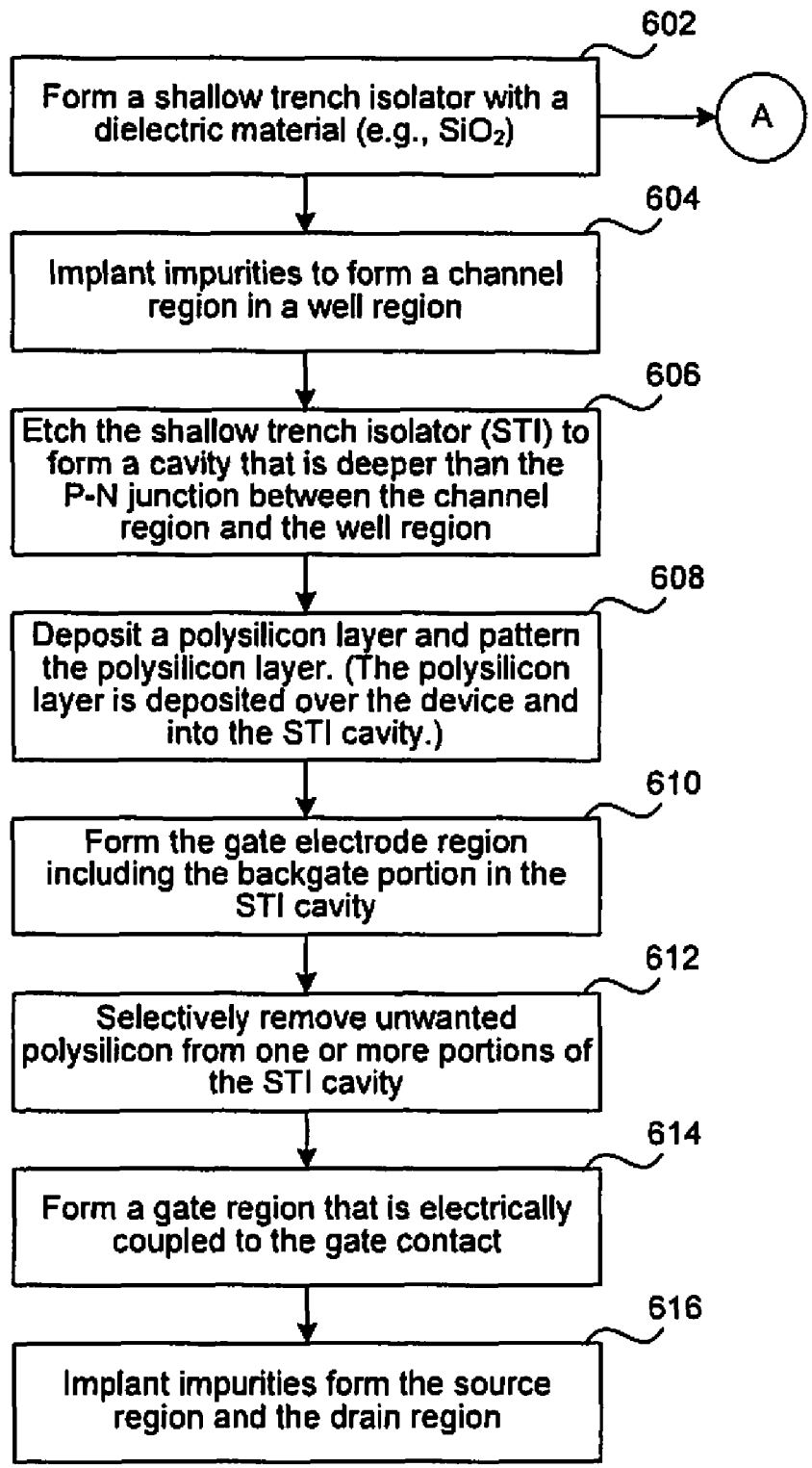
FIG. 7 illustrates an example process flow for fabricating a reduced area double gate JFET with back gate access via STI cavities, respectively, according to one embodiment.

FIG. 7 illustrates an example process flow for fabricating a reduced area double gate JFET with back gate access via STI cavities or divots 116, 118, according to one embodiment.

In process step 602, shallow trench isolator (STI) trenches are formed in a substrate 106 with a dielectric material (e.g., $SiO_2$). The substrate may be a silicon substrate, such as a p type silicon substrate, SOI, or other substrate. In one non-limiting embodiment, the substrate is a <100> oriented p-type silicon substrate. The shallow trench isolators typically define active areas for transistors, and in this instance, for JFETS and can be formed according to any known and/or convenient manner. In one embodiment, a process for forming STIs that possess the material properties suitable for selectively forming cavities of a predetermined depth at the edges of the active areas of a JFET is illustrated with further reference to FIG. 8.

Figure 8:
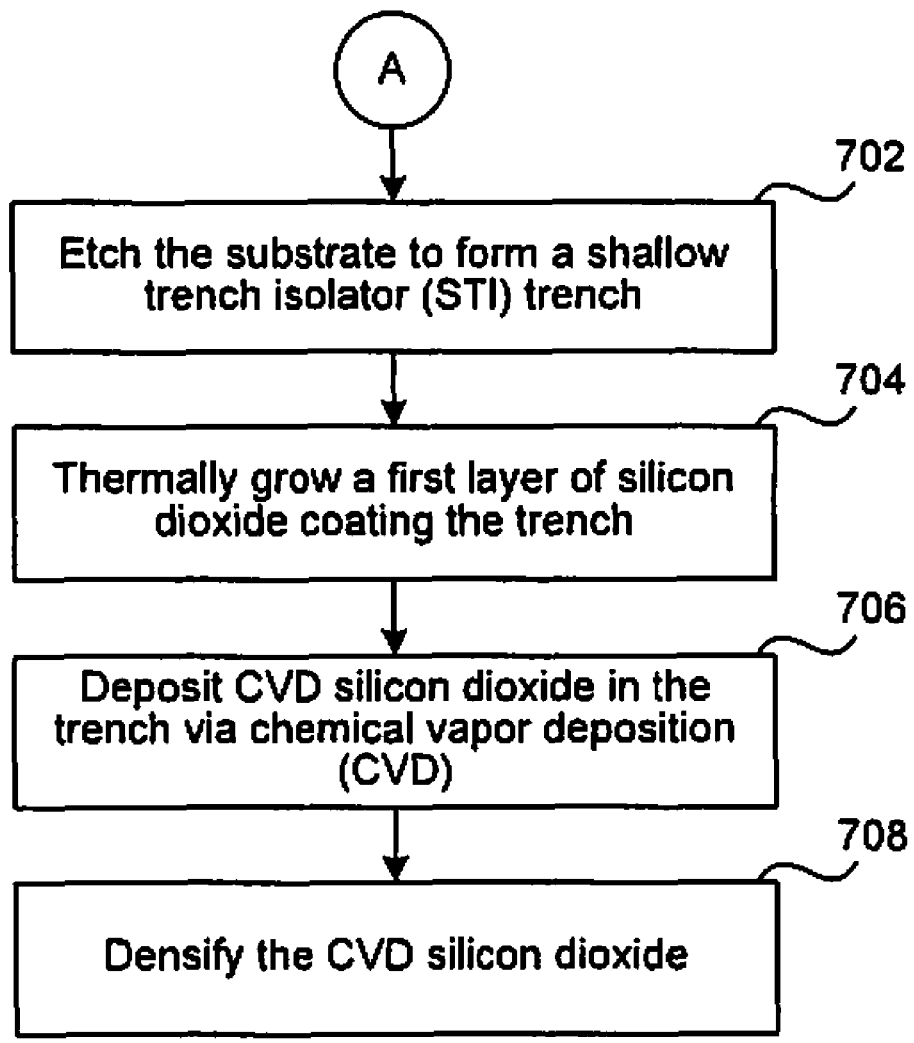
FIG. 8 illustrates an example process flow for fabricating a shallow trench isolator suitable for selectively forming cavities at trench edges, respectively, according to one embodiment.

In accordance with the non-limiting example of the process for forming the STIs of FIG. 8, the substrate 106 in non-trench regions, is covered by a silicon oxide 114 layer over the substrate, the silicon nitride layer 116 having been striped away or removed at the end of the STI formation process. The STI trenches are filled with silicon oxide that has been processed after deposition so as to expand and place regions adjacent to or abutting the STI perimeter edges of the silicon oxide under mechanical or crystal stress.

It may be noted that in at least one non-limiting embodiment, a CVD silicon oxide 112 is deposited in the trenches to fill the trenches, and then the CVD silicon oxide 112 is caused to expand such as by heating to densify the CVD silicon oxide and cause stress to build at its outer boundary that is adjacent to or abuts the substrate 106 including for example the channel region 102 and the well region 104 when present. After the thermal densification this stressed layer is referred to as a liner or thermal oxide layer 110 that has been mechanically or physically stressed as a result of the densification step. Regions further away from the perimeter are less stressed or unstressed and are referred to as being CVD oxide 106. It may be appreciated that the boundary between stressed and unstressed may not be a sharply defined as a single line illustrated in the drawings. The more vigorously etched region may therefore includes the region of the CVD that has been highly thermally stressed as well as the less stressed region extending from the edge into the non-stressed CVD oxide 112. The stressed state of the liner or thermal oxide 110 in the trenches is advantageously used to achieve a differential etching as described hereinafter.

In another non-limiting embodiment, a separate layer of thermal oxide 110 is actually deposited to line the STI trench and then the CVD oxide 112 is separately deposited. Then the structure is processed such as by heating to primarily densify the deposited CVD oxide 110. This line and fill approach may have advantages as it permits the use of different materials, but the process involves additional steps.

In process step 604, the channel region 102 is implanted. In one non-limiting embodiment, a well region 104 is optionally formed in a JFET encompassing the channel region. The well implant can be formed according to any known and/or convenient manner. Generally, an n-well is used for a p-channel device (pJFET) and a p-well is formed for an n-channel device (nJFET). The channel region may be formed according to any known and/or convenient manner, for example, by dopant diffusion and/or ion implantation. The well and channel implants can be done before or after STI trench formation.

For an nJFET or pJFET, preferably setting energies for shallow channel depths, approximately less than about 50 to 1000 angstroms (about 5 to 100 nm) deep, more advantageously between about 50 to 500 Angstroms (about 5 to 50 nm) deep, where the dosage may be set to achieve high P+ or N+ conductivity in the channel, depending upon the particular type of device being built although other depths may be implemented, without deviating from the novel aspects and features of the embodiments. In particular, p-type dopants are used for channel formation in a pJFET and n-type dopants are used in an nJFET. By way of example but not limitation, in a silicon based device, materials with five valence electrons such as phosphorus and/or arsenic can be used to for n-type doping and materials with three valence electrons such as boron and/or gallium can be used for p-type doping.

If an enhancement mode device is to be built, the doping profile of the channel (junction depth and impurity concentration) and the doping profiles of the well and gate regions may advantageously be coordinated so that the depletion region above the channel-well junction meets the depletion region below the gate-channel junction at zero gate bias so as to pinch off the channel.

In some embodiments, a second or punch through implant region doped to the opposite conductivity type as the channel is implanted adjacent and under the channel with a doping profile selected to cause the transistor to have the desired characteristics.

For example, if enhancement mode operation is desired, the punch through region is doped N+ in a P-channel JFET to force the depletion region around the back gate junction (the PN junction between the channel region and the punch through region or well region in embodiments where the punch through region is not used) to move up to meet the depletion region below the front gate PN junction (the junction between the gate region and the channel region) so as to pinch off the channel region at zero gate bias. This creates an enhancement mode device in which no drain current flows until sufficient voltage of the correct polarity is applied to the gate so as to alter the depletion region situation enough to bring the channel region out of a pinched off state In process step 606, the pad oxide 114 is etched to expose the active area substrate surface, which in one non-limiting embodiment may be a single crystal silicon substrate surface. This pad oxide layer 114 etch step also etches the STI trench stressed liner or thermal oxide layer 110. The stress causes densified or thermal silicon oxide 110 lining the trenches or CVD oxide at the edge of the trenches to etch at a higher rate (for example, between about 1.1 and about 2 times faster according to some results, though these are not limitations of the invention or of embodiments of the invention), and cavities or divots 116, 118 of which those illustrated (See FIG. 2B) are typical, are formed at STI edges during the pad oxide 114 etch step which also includes the STI liner thermal oxide etch. It may be appreciated that the faster etch of the stressed oxide that results in differential etching of the liner or thermal oxide 110, relative to other exposed oxides such as the pad oxide 114 and the CVD oxide 112 filling the trenches, may be used to advantage to form the desired structures.

It may also be appreciated that the amount or magnitude of stress may be modified by selection material properties, densification process, dimensions, and other factors to achieve a desired cavity or divot structure that may vary for example according to the desired device structure and/or operating characteristics, device line widths or design rules, or other factors. In any event, the STIs are etched at the edges to create the cavities or divots 116, 118 along the perimeter of the active area. In at least one non-limiting embodiment, no additional process step is required to form the cavities or divots beyond the oxide 114 etch step. In one embodiment, the cavities 116, 118 are formed to a depth that at least just reaches or exceeds a depth that is just past the depth at which the back gate will be formed (e.g. the depth of the P-N junction between the channel region 102 and the well region 104 or, alternatively, between the channel region 102 and the substrate region 106 when no well region(s) are provided). The depth may be controlled by timing the etch to achieve the desired cavity or divot depth. One may provide some certainty that the depths of the divots or cavities is at least deep enough to reach the back gate by setting the etch time and rate to leave the top of CVD oxide 112 level or substantially level with the top surface of the active area.

In process step 608, polysilicon 214 is deposited to a desired depth, such as to the desired depth of the gate contact 92 (See FIG. 3A). In regions where STI trench cavities are present, the polysilicon 214 is also deposited in the cavities, such as the polysilicon filling cavities 216, 218 in FIG. 2A. In one non-limiting embodiment, polysilicon layer 214 may be approximately 50 nm thick in regions overlying the substrate and somewhat thicker in regions that also fill the cavities, but other thicknesses may be used. By way of example, but not of limitation, polysilicon having a thickness in the range between about 10 nm and about 300 nm, and more usually in the range of between about 30 nm and about 200 nm, may be used.

The polysilicon 214 may then be doped, in selected areas to desired conductivity type of the JFET being formed, using any suitable technique, such as diffusion, ion implantation, or in-situ doping. For example, in an nJFET, the source-drain polysilicon may be selectively doped using n-type impurities. When a pJFET is constructed the source-drain polysilicon may be selectively doped using p-type impurities.

In addition, in process step 608, the polysilicon layer is also patterned to form an etching mask. The polysilicon may be defined via any selective etching process (e.g., plasma etch, chemical etch, dry etch, wet etch, and the like) to form the source, gate, and/or drain contacts. The etching process may involve forming a mask to expose appropriate portions of the polysilicon. In one non-limiting embodiment, the etching advantageously includes an anisotropic etch of the polysilicon 214 to leave or define a gate surface contact, such as gate surface contact or electrode 314.

Optionally, but advantageously, the etch to remove polysilicon in divots 116, 118 at all locations on the perimeter of the active area 90 except under the polysilicon gate contact strip where it intersects the perimeter of the active area may be monitored, such as by scanning electron microscope inspection, a tunneling electron microscope, a contrast test, or by other known processes.

In process step 610, the gate electrode region is formed by performing the appropriate masking and doping processes. In one embodiment, the gate electrode region includes the back-gate formed by polysilicon filled cavities. For example, the regions outside the polysilicon gate contact are masked and impurities are used to dope the gate contact (p-type for nJFET and n-type for pJFET). Alternatively, the gate contact can be doped during an N+/P+ implant when the source and drain region implants are being performed.

In process step 612, unwanted polysilicon is removed select portions of the cavities. As illustrated in the examples of FIG. 4 and FIG. 5, the STI cavities formed at channel edges of a reduced area double-gate JFET have polysilicon whereas STI cavities formed at drain/source edges ideally do not. Therefore, the unwanted polysilicon in STI cavities can be removed via any known and/or convenient manner. For example, anisotropic etch is performed to remove polysilicon from select portions of the STI cavities. In addition, scanning electron microscopy (SEM) can be performed for inspection after the polysilicon etch to image the cavities for identifying residual unwanted polysilicon.

In process step 614, a gate region is formed. For both nJFET and the pJFET, the gate junction depth is generally approximately 15-20 nm although other implantation depths may be implemented. The gate region may have a depth that is typically between about 5 nm and 20 nm. The gate region can be formed by thermally annealing implanted impurities in the gate contact and driving-in impurities from polysilicon into underlying channel to form gate region. In an alternative embodiment, the thermal drive-in after the dopant implant when the source and drain region implants are being performed. The source/drain/gate length is generally 60 nm each however alternate dimensions may be implemented. In one embodiment, the source/drain/gate region doping density is approximately $1e^{20}$-$2e^{20}/cm^3$.

Dielectric sidewall spacers are optionally formed about the polysilicon gate for mitigating high fields between the gate and the channel. For pJFET or nJFET devices, each sidewall spacer is generally approximately anywhere between 0-15 nm along the length of the device. The sidewall spacers may include two layers. More particularly, the sidewall spacers include a first layer of silicon dioxide immediately adjacent to the polysilicon followed by a layer of silicon nitride. In one embodiment, the sidewall spacers include a single layer sidewall material of, for example, silicon dioxide.

The layer of silicon nitride and silicon dioxide are etched to form dielectric spacers that protect the vertical edges of said polysilicon gate surface contact and the vertical edges of said active area in the STI cavities (otherwise referred to as 'divots') not filled by polysilicon.

In process step 616, the source and drain regions are formed by implanting impurities into the source and drain regions. Advantageously, the source and drain regions may be formed by a process that forms self-aligned source and drain regions. In one embodiment, a layer of photoresist is deposited, masked, and developed to form an implant barrier protecting the polysilicon gate surface contact from further implantation during gate/drain formation. Ion implantation for example, is then performed on exposed areas of the active area for forming self-aligned source and drain regions. After the source/drain formation, the photoresist covering the polysilicon gate contact can be removed.

In embodiments that provide dielectric spacers, the dielectric spacers may be used as a mask. For a pJFET, p-type impurities are used. For an nJFET, n-type impurities are used. The source and drain regions may be formed according to any known and/or convenient manners, for example, by the diffusion of dopants through a corresponding polysilicon depositions, by ion implantation or by other know or convenient means.

For both an n-type JFET and a p-type JFET, the source/drain junction depth is typically between approximately 70-75 nm although other implantation depths may be implemented, and other non-limiting embodiments may use source/drain junction depths that are in the range from about 10 nm to about 100 nm, and more usually between about 20 nm and 80 nm. In general, the source and drain depth is deeper than the P-N junction (e.g., the junction between the p-type channel and the n-well, or the p-type channel and the N+ punch through region, for a pJFET).

From herein the process, the remainder of the JFET is formed using suitable fabrication techniques. For example, at least depositing a metallic material over one or more of the source region, the drain region, and gate region to form one or more ohmic contacts, and forming the metal interconnects, including, depositing interlayer dielectrics, etching contact holes, depositing barrier metals, etc. Silicide may be optionally deposited over the polysilicon gate region to decrease the contact and series resistance. Furthermore, silicide may be also be optionally formed on the exposed single crystal silicon of the source and drain regions.

Contact holes may be etched to form source, gate, and/or drain contacts. A barrier layer metal such as Ti/TiN may be deposited at the bottom of each contact hole. The contact holes may be filled with tungsten to prevent the metallic contact in the contact holes from reacting with the silicide or diffusing into the underlying substrate. Once the contact holes are optionally filed, a layer of contact metal (e.g., copper or aluminum) can be deposited and etched to form the source, drain, and/or gate contacts and/or additional interconnects.

It may be appreciated in light of the description provided here that in one aspect, there is provided a process and associated sub-processes for creating the over-etch trenches, cavities or divots in the densified STI stressed thermal oxide around the edge of the active area to at least the depth of the back gate PN junction, and filling the divots or cavities with doped polysilicon under the gate contact polysilicon stripe. The divots or cavities are formed deep enough to reach a region doped to the opposite conductivity type as the channel (such as the substrate or the well region under the channel) or any other which is formed under the channel. Further, the well and channel implants can be done before or after STI trench formation.

The process may optionally, but advantageously include monitoring the polysilicon etch to ensure that any polysilicon stringers in the divots have been removed from the areas outside the perimeter of the gate polysilicon stripe. Also, one can form metal contacts to the source and drain regions or polysilicon contacts to these areas.

It may also be apparent to those having ordinary skill in the art in light of the description provided here that the process for forming and using the divots or cavities with the STI trenches as well as the associated structure provide significant advantages for achieving double gate operation.

First, there is no substrate area penalty on the overall size of the device to achieve double gate operation because any conventional need for a separate active area for the well/back gate contact is eliminated. For example, conventional metal bridge, back gate contacts, and a gap between an active area and a surface metal interconnect to connect the front gate and back gate contacts together are eliminated as is the space consumed by the STI trench between the main active area and the adjunct active area over which the well/back gate contact is formed. The area consumed by the conventional metal interconnect on the surface between the gate and the back gate contact is also eliminated.

Second, the double gate device provides significantly higher drain current and faster switching than a single gate device.

Third, selective double-gate operation versus single-gate operation may be chosen for only selected devices on a substrate by proper masking thereby enabling flexibility in speed/power trade-offs. This choice between single-gate and double-gate operation in structures that do not use the divot or cavity structure entails an area penalty for each device structured to operate as a double gate. Selective double gate operation for only some devices on a chip is achieved by using more oxide etch and selectively opening mask holes along the polysilicon gate locations of devices to be enabled for double gate operation.

The order of the processes described herein can be alternated. Additional or fewer steps may be needed. For example, the order in which the well, channel region, and/or gate regions are formed can be varied as needed or deemed suitable. In a further example, the gate surface contact can be doped when the polycrystalline silicon is etched with a mask and implant step after the polysilicon etch, or with an implant of N-type impurities before the polysilicon etch.

In addition, although a process for polysilicon contacts is described, it is acknowledged that metal contacts may be used for one or more of the gate contact, drain contact, and/or source contact in an enhanced hole mobility pJFET and is considered to be within the novel techniques herein described. The example process described in association with FIG. 7 can be suitably modified as convenient or as needed for incorporation of deposition of metal contacts in lieu of polysilicon contacts and is also considered to be within the novel aspects of the techniques herein described.

FIG. 8 illustrates an example process flow for fabricating a shallow trench isolator suitable for selectively forming cavities at trench edges, according to one non-limiting embodiment.

In one non-limiting embodiment, a layer of silicon dioxide (pad oxide) 114 is grow on the substrate 106, such as by thermal growing. Then, a layer 116 of silicon nitride (nitride) is deposited, such as by Chemical Vapor Deposition onto the oxide layer 114. Then the STI structures are formed in the trench region 108 within the substrate 106.

In process step 702, the substrate 106 (such as for example, silicon or SOI) with the pad oxide 114 and nitride 116 layers, is etched to form a shallow trench isolator (STI) trench 112.

In process step 704, a first layer of silicon dioxide coating (thermal or liner oxide) 110 the trench is thermally grown. In process step 706, chemical vapor deposition (CVD) is performed to deposit CVD silicon dioxide in the trench. In process step 708, the CVD oxide is polished back to the top of the top of the silicon nitride layer 116. In one non-limiting embodiment, about 500 Angstroms of silicon nitride remains after the CVD polish back. In process step 710, the CVD silicon dioxide is densified to make the oxide 112 denser, for example, by subjecting the STI CVD oxide 112 to a known high temperature densification step to make the CVD oxide more dense. This densification causes the oxide 112 to expand and puts mechanical or physical stress on the silicon of the active area, particularly when the silicon is single crystal silicon. It may also have an effect on the crystal structure that results in a greater etch rate. The silicon nitride layer 116 is then striped or removed leaving the silicon oxide 114 layer over the substrate. It may be appreciated that other processes may be used for depositing or growing the oxide, such as for example by the use of a high density plasma oxide or other known or convenient means, but that the densification of the deposited oxide is still performed, most usually by heat densification.

In some non-limiting embodiments, the doping profiles (junction depths and doping concentration) of the gate, channel, and well regions (when present) are coordinated so as to achieve enhancement mode operation such that zero drain current flows at zero gate-to-source bias. This technique involves controlling these junction depth and doping concentration parameters so that the depletion region below the gate-channel (front gate) PN junction physically meets the depletion region above the channel-well PN junction at zero gate-to-source bias. This is a state of pinch-off and no drain current flows. As the front gate and back gate PN junctions are biased toward a forward biased condition, the depletion regions shrink in size and recede toward their respective junctions. This opens up the channel, and if suitable drain voltage is applied, drain current will begin to flow.

It may also be appreciated in light of the description provided herein that there are many ways to make Junction Field Effect Transistors using STI trenches, and the teachings of the invention and of the various embodiments are applicable to all of them. All ways of making JFETs which use STI trenches which are over-etched to form divots or cavities at the edges of the active area, and particularly those which are deep enough to reach the well under the channel with the divots filled with doped polysilicon under the gate contact polysilicon stripe are contemplated. The particular manner in which other parts of the JFET or its substructures are formed and in what sequence is not important. In some non-limiting embodiments, the channel is advantageously formed before the etch of the STI oxide so that it is known how deep the channel is so that the depth of the etch can be properly controlled. However, in some other non-limiting embodiments where the depth of the channel can be controlled precisely, the STI etch can precede formation of the channel and then the channel is formed so as to have a depth for the back gate PN junction which is less than the depth of the divots.

The above detailed description of embodiments of the invention is not intended to be exhaustive or to limit the teachings to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the invention provided herein can be applied to other methods, devices, and/or systems, not necessarily to those described above. The elements and acts of the various embodiments described above can be combined to provide further embodiments.

What is claimed is:

1. A process for making a double gate structure for a Junction Field Effect Transistor, comprising:
    A) thermally growing a layer of silicon dioxide (pad oxide) on a silicon substrate;

B) depositing a layer of silicon nitride over said silicon dioxide layer;

C) forming in said silicon substrate, so as to define the perimeter of an active area, a Shallow Trench Isolation trench (STI trench) filled with silicon dioxide deposited by chemical vapor deposition (CVD oxide) at least a portion of which has been densified so that said silicon dioxide is stressed at the edges of said STI trench, and polishing said CVD oxide back to flush with the top of said nitride layer;

D) removing said nitride layer;

E) etching away said layer of silicon dioxide (pad oxide) with a silicon dioxide etch process that also etches said stressed silicon dioxide at the edges of said STI trench to form divots;

F) forming a doped channel region in a well of opposite conductivity in said active area so as to form a back gate PN junction;

said divots being at least deep enough that any conductive material in said divots will be in electrical contact with said well;

G) forming a doped channel region in a well of opposite conductivity in said active area so as to form a back gate PN junction;

H) depositing a layer of polysilicon over the whole structure so as to cover said active area and fill said divots around the perimeter of said active area;

I) selectively doping portions of said polysilicon layer with appropriate conductivity enhancing impurities in a location where a gate surface contact is to be formed; and J) patterning and anisotropically etching said polysilicon layer so as to form a polysilicon gate surface contact with a doped polysilicon stringer under said polysilicon gate surface contact at the intersection of said polysilicon gate contact and said perimeter of said active area.

2. The process of claim 1, wherein the channel region formed is formed by ion implantation of suitable conductivity impurities with energy of said implant such as to form a channel with a channel-well junction at a shallow depth.

3. The process of claim 2, wherein said shallow depth is substantially 100 nm or less.

4. The process of claim 1, wherein the step of patterning and anisotropically etching includes the process of monitoring the progress of said etch step to ensure polysilicon is removed from said divots at all locations except at the intersection of said polysilicon gate surface contact and the perimeter of said active area.

5. The process of claim 4, wherein said monitoring step is carried out using at least one of a scanning electron microscope, a tunneling electron microscope, a contrast test, and any combination of these three.

6. The process of claim 1, further comprising the steps:

K) keeping in place the cross-linked photoresist that was put into place to etch the polysilicon layer to prevent further doping of said polysilicon, doing an ion implantation into the exposed active area silicon to form highly conductive doped link regions of the same conductivity type as said channel;

L) depositing a layer of silicon dioxide over the substrate;

M) depositing a layer of silicon nitride over the substrate; and

N) anisotropically etching said silicon nitride layer and anisotropically etching the silicon dioxide layer to form dielectric spacers that protect the vertical edges of said polysilicon gate surface contact and the vertical edges of said active area in said divots in all locations where polysilicon is not covering said divot.

7. The process of claim 6, further including the steps of:

O) deposit photoresist, mask and develop to form an implant barrier protecting said polysilicon gate surface contact from further implantation;

P) performing an ion implantation into exposed areas of said active area adjacent said dielectric spacers to form self-aligned source and drain regions of the same conductivity as said channel;

Q) removing the photoresist covering said polysilicon gate contact; and

R) forming silicide on top of the polysilicon gate contact and on the exposed single crystal silicon of said source and drain regions.

8. The process of claim 7, further including the steps of:

S) depositing a layer of dielectric material over the substrate;

T) patterning and etching said layer of dielectric material to form contact holes down to the silicide on top of said polysilicon gate contact and down to the silicide on top of the source and drain regions;

U) forming a layer of barrier metal in the bottom of each contact hole to prevent later deposited metal from reacting with said silicide; and V) depositing a layer of metal in said contact holes and patterning and etching said metal to form metal source, drain and gate contacts and interconnects.

9. A JFET transistor having a double gate structure formed according to the process of claim 1.

10. A method for making a double gate Junction Field Effect Transistor (JFET), the method comprising the steps of:

forming in a semiconductor substrate a Shallow Trench Isolation Trench (STI), defining an active area of said JFET so as to establish the perimeter of the area;

said STI forming comprising growing a liner silicon dioxide on the walls of said STI and filling with an additional dielectric to place the liner silicon dioxide under stress;

said active area comprising a channel region of a first conductivity type, and formed in a well of a second conductivity type to form a PN junction back gate;

removing at least a portion of said liner silicon dioxide from the walls along said STI trenches, such as to create divots in the silicon dioxide along the edges of said STI along the perimeter of said active area;

said removing step comprising etching the liner silicon dioxide down to at least a depth such that any conductive material deposited in said divots will make electrical contact with said well;

forming a doped polycrystalline silicon gate surface contact over said active area and sized so as to extend over the perimeter of said active area at one or more locations;

forming a doped gate region of said second conductivity type above said channel region and in electrical contact with said gate surface, the interface between the gate and channel regions forming a PN junction front gate; and forming a doped polysilicon stringer in the portion of said divots under the intersection of the gate surface contact and perimeter of said active area, so as to form a double gate structure providing an electrically conductive path between said front and back gates.

11. The method of claim 10, wherein:

growing said liner silicon dioxide comprising thermally growing the silicon dioxide;

filling said additional dielectric comprising filling said STI with a silicon CVD oxide deposited using chemical vapor deposition (CVD); and the method further comprising:

performing a densification process unto said silicon CVD oxide, to make the CVD oxide more dense and capable of expanding while causing stress unto the active edges of said STI facing said active area.

12. The method of claim 10, wherein the forming of said channel region comprising forming the channel by ion implantation of conductivity impurities with a predetermined energy of the implant such as to form a channel with a shallow depth of substantially 1000 angstrom or less.

13. The method of claim 10, wherein the steps of forming the silicon gate surface contact and forming the stringer, comprising;

monitoring the progress of the etching steps associated with the forming steps, to ensure polysilicon is removed from said divots at all locations except at the intersection of the surface gate contact and the perimeter of said active area.

14. The method of claim 13, wherein said monitoring step is carried out using at least one of a monitoring process selected from the set consisting of monitoring process using: a scanning electron microscope, a tunneling electron microscope, a contrast test, and any combination of two or more of these.

15. The method of claim 10, further comprising the steps:

forming highly conductive doped link regions of the same conductivity type as said channel;

depositing a layer of silicon dioxide over said semiconductor substrate;

depositing a layer of silicon nitride over said semiconductor substrate; and etching said layer of silicon nitride and said layer of silicon dioxide to form dielectric spacers that protect the vertical edges of said polysilicon gate surface contact and the vertical edges of said active area in said divots in all locations where polysilicon is not covering said divot.

16. The method of claim 10, further including the steps of:

depositing a photoresist, and masking and developing the photoresist, to form an implant barrier protecting said polysilicon gate surface contact from further implantation;

performing an ion implantation into exposed areas of said active area adjacent said dielectric spacers to form self-aligned source and drain regions of the same conductivity as said channel;

removing the photoresist covering said polysilicon gate contact; and forming silicide on top of the polysilicon gate contact and on the exposed single crystal silicon of said source and drain regions.

17. The method of claim 10, further including the steps of:

depositing a layer of dielectric material over the said semiconductor substrate;

patterning and etching said layer of dielectric material to form contact holes down to the silicide on top of said polysilicon gate contact and down to the silicide on top of the source and drain regions;

forming a layer of barrier metal in the bottom of each contact hole to prevent later deposited metal from reacting with said silicide; and depositing a layer of metal in said contact holes and patterning and etching said metal to form metal source, drain and gate contacts and interconnects.

18. The method of claim 10, further including the steps of:

prior to forming said STI, forming a layer of silicon pad dioxide on a semiconductor substrate and depositing a layer of silicon nitride over said silicon pad dioxide layer; and removing said silicon nitride, and etching off the pad dioxide which includes etching off the liner dioxide;

the etching rate of the stressed liner oxide being faster than the rate of the pad oxide, so as to induce the creation of said divots.

19. A JFET transistor having a double gate structure formed according to the method of claim 10.

* * * * *